United States Patent [19]
Dolins et al.

[11] Patent Number: 4,846,928
[45] Date of Patent: Jul. 11, 1989

[54] PROCESS AND APPARATUS FOR DETECTING ABERRATIONS IN PRODUCTION PROCESS OPERATIONS

[75] Inventors: Steven B. Dolins, Dallas; Aditya Srivastava, Richardson; Bruce E. Flinchbaugh, Dallas; Sarma S. Gunturi, Richardson; Thomas W. Lassiter, Garland; Robert L. Love, McKinney, all of Tex.

[73] Assignee: Texas Instruments, Incorporated, Dallas, Tex.

[21] Appl. No.: 224,205

[22] Filed: Jul. 22, 1988

Related U.S. Application Data

[63] Continuation of Ser. No. 81,494, Aug. 4, 1987, abandoned.

[51] Int. Cl.⁴ .................. B44C 1/22; C03C 15/00; C03C 25/06
[52] U.S. Cl. ...................... 156/626; 156/643; 156/646; 156/345; 204/192.33; 204/298
[58] Field of Search ............... 156/626, 627, 643, 646, 156/653, 657, 662, 345; 356/316, 326, 381, 437; 204/192.33, 192.37, 298

[56] References Cited

U.S. PATENT DOCUMENTS 4,479,848 10/1984 Otsubo et al. .................. 156/626
4,493,745 1/1985 Chen et al. .................... 156/626
4,569,717 2/1986 Ohagami et al. ................ 156/626
4,615,761 10/1986 Tada et al. .................... 156/626

Primary Examiner—William A. Powell
Attorney, Agent, or Firm—Melvin Sharp; James T. Comfort; Lawrence J. Bassuk

[57] ABSTRACT

An improved apparatus and process for detecting aberrations in production process operations is provided. In one embodiment, operations of a plasma etch reactor (10) are monitored to detect aberrations in etching operations. A reference end-point trace (EPT) is defined (62) for the etch process. Regions are defined in the reference end-point trace (70) and characteristics and tolerances for each region are defined (72-80). The etcher is run and an actual EPT is obtained (82) from the running of the etcher. The actual EPT is analyzed to identify proposed regions of the actual EPT (86), and then the proposed regions of the actual EPT are matched with regions of the reference EPT (96). The system employs a series of heuristic functions in matching proposed regions of the actual EPT with regions of the reference EPT. Characteristics of the matched regions of the actual end-point trace are compared (66) with characteristics of the corresponding regions of the reference end-point trace to determine whether aberrations have occurred during the etch process. The invention provides for an improved matching and improved comparison of actual end-point traces with reference end-point traces.

39 Claims, 3 Drawing Sheets

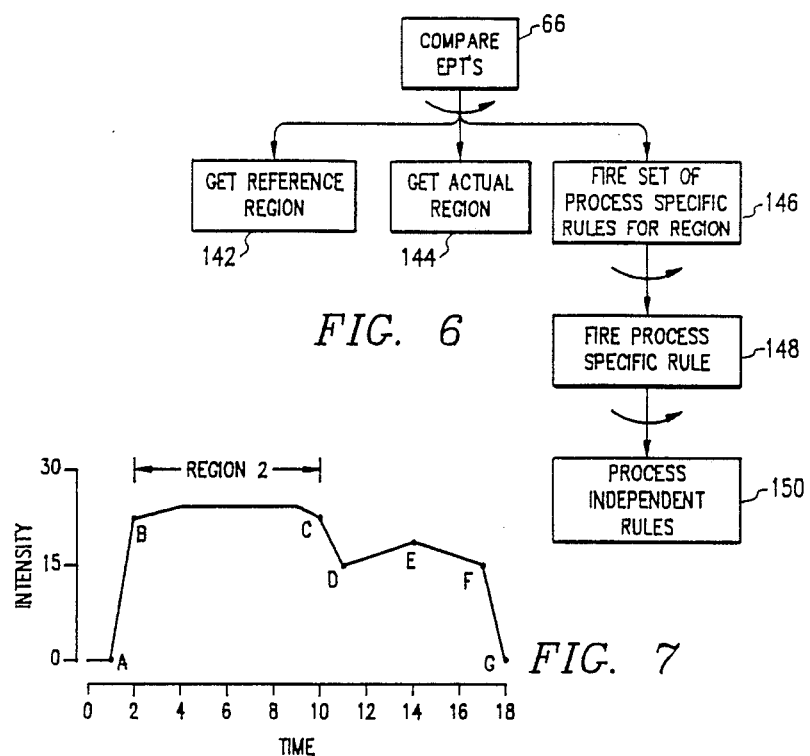
FIG. 6
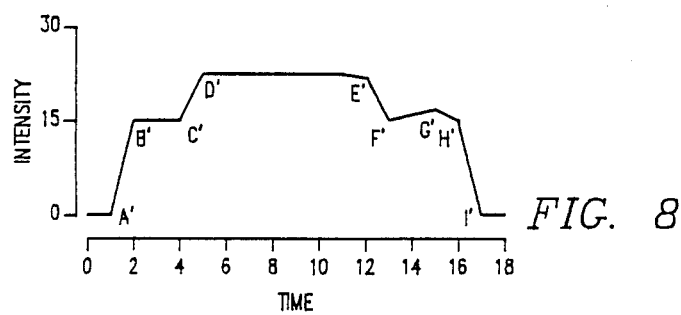
FIG. 7
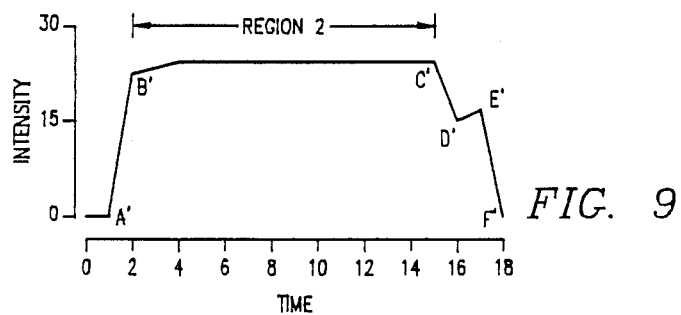
FIG. 8
FIG. 9

PROCESS AND APPARATUS FOR DETECTING ABERRATIONS IN PRODUCTION PROCESS OPERATIONS

This application is a continuation of application Ser. No. 081,494, filed 9/4/87, now abandoned.

FIELD OF THE INVENTION

The present invention relates to the field of automated quality control and process operations, and more particularly to an improved method and apparatus for detecting aberrations in production process operations.

BACKGROUND OF THE INVENTION

The manufacture of semiconductor devices comprises the composite of numerous processing steps on each semiconductor device. A variety of attempts have been made to establish quality control checks on the various processes during the manufacture of the semiconductor devices. The systems for these quality control checks usually include some manner of physically inspecting or testing selected specimens of the semiconductor devices at various stages during the manufacturing processes. However, such systems are often cumbersome, relatively costly, and since they are conducted, in many cases, only on randomly selected devices from the manufacturing processes, cannot guarantee the quality of each of the devices manufactured. Moreover, the previously developed systems serve to detect problems in the manufacturing process at points in time after the errors have already been made. As a consequence, the same error may have been repeatedly made during a particular processing operation on a large number of semiconductor devices before the error is detected at a later quality control inspection. It is clearly of economic interest to the manufacturing concern to detect aberrations in the manufacturing processes as early as possible after those aberrations occur. It is even more preferable to be able to detect those aberrations in real time, in other words, at the point in time at which they are occurring. Such instantaneous detection can be used to avoid duplication of the same process aberration to repeated semiconductor devices during manufacture.

A common processing operation in the production of semiconductor devices is a plasma etch. In the plasma etch, a semiconductor device in a form commonly termed a slice is positioned in an etching chamber in the presence of specified gases, at predetermined pressures and temperatures, and an RF power source is applied. In the etch, particular materials on the surface of the semiconductor slice react with gases in the chamber and then volatilize from the surface of the slice. A typical etch process for a slice can proceed for less than one minute up to or over several minutes.

Conventional etch reactors typically include apparatus to monitor particular aspects of the etching process. The reactors include apparatus to provide on-line hardware monitoring, e.g. to monitor the temperature and pressure of the reactor, the wattage of the RF power source, and the flow of feed gases. Prior art etching equipment also includes apparatus designed to detect the end-point of the etching operation. *Methods of End-Point Detection for Plasma Etching*; Paul J. Marcoux and Pang Dow Foo, Solid State Technology, April 1981, pp. 115-122, incorporated herein by reference, describes several methods proposed for such apparatus. Such proposed methods include methods of emission spectroscopy, optical reflection, mass spectroscopy, impedance monitoring, Langmuir probe monitoring and pressure monitoring. The end-point monitoring apparatus, with whatever monitoring method is used, serves to detect the end of the desired etch reaction so that the etcher can be instructed to terminate its etch cycle and ready itself to etch a fresh slice.

A frequently applied method of end-point detection utilizes an end-point trace (EPT). An EPT is a measure, obtained by emission spectroscopy procedures, of the concentration of gases in the plasma over the surface of the slice being etched. The EPT can be designed to monitor either reactants or products of the etch reaction. For example, by tuning the EPT to measure those gases which are desired etch products, the monitoring apparatus can detect when those products are no longer being emitted into the plasma, thus signaling the end of the desired etch reaction. Typically, the end-point detectors are designed to look for a sharp change in the concentration of the monitored species at a time into the etch process approximately when the end-point is expected. The apparatus is useful in that it provides a signal to the etching equipment to proceed to end the etch cycle, remove the etched semiconductor slice, and insert a fresh semiconductor slice into the etching chamber.

The end-point detectors, whether applied or merely theoretical, however, are subject to several limitations. A principal limitation is that the detectors serve only to detect the end of etching operations. Accordingly, the detectors provide no information as to whether the etch process has proceeded in an optimum fashion or whether aberrations in the process occurred.

A need has arisen for a process or apparatus which can determine whether the etching process is proceeding or has been accomplished in an optimum fashion. Such an etch monitoring system which could automatically check the etch of every slice would also overcome numerous disadvantages referred to above with regard to current semiconductor manufacture quality control systems. Moreover, it would be advantageous if a system could monitor the etch process in such a fashion as to provide information regarding whether layers formed on the semiconductor device prior to the etching operation were formed and treated in the intended manner.

The prior art devices and processes are not able to provide the above mentioned desired advantages.

In a co-pending application Ser. No. 046,497, currently pending, assigned to the assignee of the present application. and filed May 4, 1987, before the invention of the present application, is disclosed a method and apparatus for detecting aberrations in cyclically repeated process operations. A particular application of the invention described in that application is in regard to plasma etch processes in the production of semiconductor devices. In an embodiment of the invention of that application, the actual end-point trace (EPT), for the etch of each semiconductor slice is compared in detail with a predetermined reference EPT to determine not only whether the etch has proceeded as intended, but also to determine whether certain operations prior to etching have been properly carried out on the slice.

The present invention provides an improved method and apparatus to that disclosed in the related application.

SUMMARY OF THE INVENTION

The present invention provides an improved process and apparatus for detecting aberrations in cyclic or repeated process operations. A particular application of the present invention is in regard to plasma etch processes in the production of semiconductor devices. In an embodiment of the present invention applied to end-point trace data, the invention provides an improved analysis between actual end-point trace data for the etch of a semiconductor slice and a predefined reference end-point trace for the particular etch process being conducted. It has been discovered that in the practice of the present invention, analysis of the end-point trace data can, in many cases, suggest probable causes of detected aberrations in the etch reaction. In some cases, also, in the present invention, analysis of the end-point data can provide valuable information regarding the layers of material formed on the semiconductor device prior to the etching process.

In an embodiment of the present invention used in conjunction with the plasma etcher, the actual end-point trace for the etch of each slice is compared in detail with a predetermined reference EPT to determine not only whether the etch has proceeded as intended, but also to determine whether certain operations prior to etching have been properly carried out on the slice. For example, the present invention can analyze such situations as where a deposition is too thick or too thin, where a photolithography step has been omitted or incorrectly conducted in that certain stuctures are still covered.

In an embodiment described in the preceding paragraphs, a reference EPT is first defined. The reference EPT is divided into regions, each having significance as to corresponding junctures or steps in the etching process. An actual EPT is obtained during the etching of each semiconductor slice. The actual EPT is divided into regions on the basis of the change in slope of points on the actual EPT. A series of heuristic functions is applied to match regions of the actual end-point trace with corresponding regions of the reference EPT by comparing characteristics of a proposed matching region of the actual EPT with characteristics of a region of the reference EPT to be matched. When each of the regions of the actual EPT has been matched to a region of the reference EPT, predetermined characteristics of each region are compared with corresponding characteristics of corresponding regions of the reference EPT. This comparison is made by executing a set of rules which have been adopted to the specific process being monitored. These rules are termed "process specific" rules. The process specific rules call a set of rules which compare a generic set of characteristics of any two regions. These latter rules are termed process independent rules. With the comparison of the regions of the actual EPT with the regions of the reference EPT, the system can identify when aberrations have occurred in the etching operation. The system can also, by its detailed analysis of the regions, and the application of process specific rules, suggest probable causes for the aberrations identified.

The present invention provides a system with the advantage of an improved capability to analyze and compare continuously variable data curves with continuously variable reference curves.

A particular advantage of the present invention is that it can tolerate variations in the duration or the shape of the particular regions of the actual data curve and still identify the predefined regions of the actual data curve and compare them with the corresponding regions of the reference curve. This is of particular advantage since, for a variety of reasons, the duration of one or more regions of the actual data curve can vary significantly from curve to curve. To accurately analyze each actual data curve, it is crucial to first accurately identify the beginning and ending points and duration of each region of the curve.

Yet another advantage of the present invention is that it defines and compares regions of a continuously variable curve which regions of the actual data curve can not only "stretch" in duration, but which can also "float" in time. For example, if an early region of a data curve is of an overly long duration, the present invention can allow for such extended duration and still identify the boundaries of subsequent regions in the data curve.

Another advantage of the present invention is that it is modular, and so the system can be easily and quickly applied to varying etch or manufacturing operations.

BRIEF DESCRIPTION OF THE DRAWINGS

The present invention will be described with reference to the accompanying drawings, wherein:

FIG. 6 is a structure chart, according to the embodiment of FIG. 3, illustrating the function of comparing the end point traces;

FIG. 7 shows an example of a reference end-point trace with intensity plotted as a function of time;

FIG. 8 shows an example of a first actual end-point trace to be matched against the reference end-point trace of FIG. 7; and FIG. 9 shows an example of a second actual end-point trace to be matched against the reference end-point trace of FIG. 7.

DETAILED DESCRIPTION OF THE INVENTION

Figure 1:
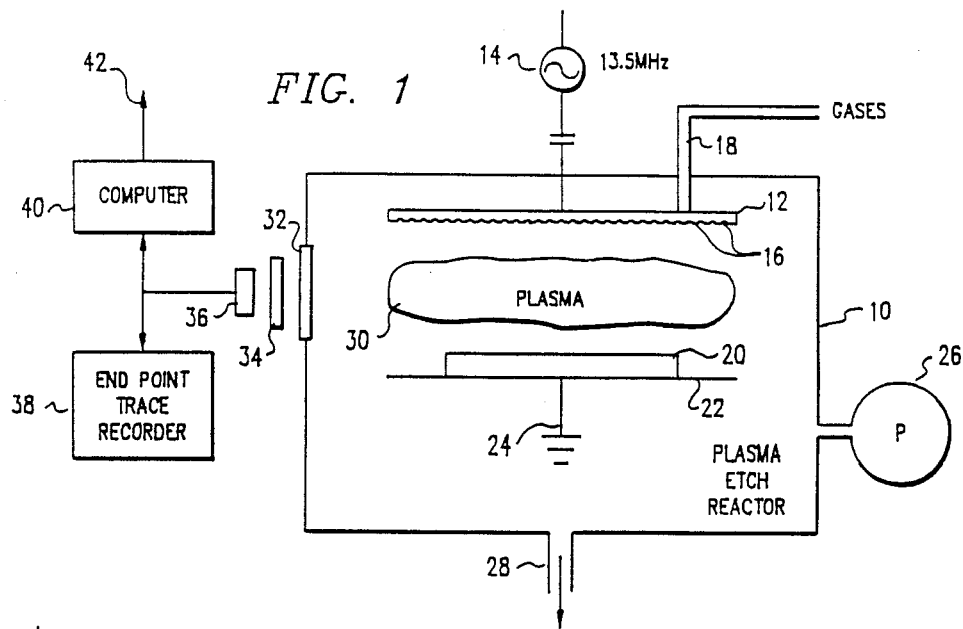
FIG. 1 shows a diagrammatic view of a typical plasma etch reactor including an end-point trace monitoring apparatus and a computer means according to an embodiment of the present invention.

As pointed out above, the present invention provides an improved process and apparatus for detecting aberrations in repetitive-type process operations. The present invention has application for such repetitive process operations which can be monitored by a device to provide a continually variable electrical signal or signature which correlates to the progress of the process being monitored. One type of such continually variable electrical signal utilized in the present invention is time based, meaning that it varies over time. Also, the signal can be one of intensity which varies over time. Such signals frequently can be broken down into regions which correspond to portions or steps of the process being carried out. It is also important that the signal be one for which a preferred or reference signal can be defined, wherein the reference signal represents the signal expected when the process proceeds in the preferred fashion. Accordingly, the actual signal received during operation of the process can be matched against the characteristic signature of the reference signal.

In the present invention, a reference curve is defined which corresponds to the expected appropriate continually variable signal for whatever sensing device is monitoring the process. During the operation of the process, an actual curve is obtained representing the output of the sensing device. Either during the processing cycle or afterwards, the regions of the actual curve are matched against corresponding regions of the reference curve to determine whether the actual curve suggests that the process is proceeding or has proceeded in the preferred fashion or whether the actual curve suggests that aberrations have occurred in the process cycle. The specific characteristics of each region of the actual curve which are compared with those of the reference curve, can vary from region to region and are determined by process and data considerations for the particular process steps to which those regions correspond.

Results of the comparison of actual and reference curves can be used in a variety of ways, including signaling the processing equipment to continue operations, signaling the processing equipment to halt operations, signaling the operator of the processing equipment, storing information for the particular process cycle for later use, signaling processing equipment to alter the process, either during the process or in a later process cycle, or analyzing the data to point out a particular aberration or the cause of the aberration detected.

The co-pending application, Ser. No. 046,497, currently pending, described above, discloses a method and apparatus for detecting aberrations in cyclically repeated process operations. The co-pending application describes a system in which a reference curve as well as regions in the reference curve are defined for a particular process. Further, an actual curve representing data from the process is obtained during the process and compared with the reference curve to determine whether aberrations have or are occurring in the process being monitored. The co-pending application describes use of the system in conjunction with plasma etch during operations. In the system described in the co-pending application, during analysis of the actual curve the regions of the actual curve are defined as a function of time from the beginning of the process operation.

The present invention provides an improved process and apparatus for the comparison of reference and actual continuously variable curves. The present invention comprises an improved method of defining the regions in the actual curve, with the result that the regions are more accurately defined and consequent analysis resulting more accurate. The present invention also provides an improved method utilizing sets of heuristic functions, to define and match regions of the actual curve with regions of the reference curve. This again also results in a more accurate definition of the regions of and analysis of the actual curve. The present invention also is modular and uses sets of process independent rules as well as sets of process specific rules in its analysis. Consequently, the system of the present invention is particularly well suited for easy adaptation to different and varying etch processes or other production processes.

An embodiment of the present invention has found particular application in conjunction with semiconductor manufacturing processes, particularly with plasma etch processes. Described in conjunction with FIGS. 1 through 9 below is an embodiment of the present invention adapted for application to plasma etching operations.

Shown in FIG. 1 is a diagrammatic view of a typical plasma etch reactor in conjunction with an embodiment of the present invention. The plasma etch reactor includes a plasma etch reactor vessel 10 in which is mounted a shower head electrode 12. The shower head electrode is capacitively coupled to an RF power source 14 which typically provides power at 13.5 megaHertz. The RF power source 14 has an RF tuning network not shown in FIG. 1. The electrode 12 has holes 16 therein from which are emitted gases which are fed to the electrode 12 by way of a gas line 18. The flow of the gases is controlled by a mass flow controller not shown in FIG. 1. A semiconductor slice 20 being etched is mounted on a substrate 22 of the reactor which is grounded as shown at 24. The reactor includes a pressure regulator 26 and a gas exit line 28, which is operatively connected to a vacuum system not shown in FIG. 1.

In the operation of the plasma etch reactor, a mixture of gases is fed through electrode 12 while power is supplied to the electrode from the RF source 14. A low pressure glow discharge is established to produce a reactive species in a plasma 30. The reactive species selectively react with a thin film of materials on the slice 20 to form a product which volatilizes from the slice 20 and is eventually pumped out of the reactor through gas exit line 28. The etching operation is conducted until, in a successful etch, a predetermined amount or depth of the desired material is etched away from the surface of slice 20.

The EPT from the etch reactor which is used in the embodiment of the present invention shown in FIG. 1, is obtained by methods of emission spectroscopy. The EPT sensing apparatus is able to detect the light emitted by electronically excited species in the plasma. Although the light emitted by an atom, molecule or free radical in a non-equilibrium plasma is not strictly proportional to the concentration of that species, for purposes of the EPT the proportionality can be assumed to hold. The sensing apparatus can be set to monitor the concentrations of either etch reaction products or reactive species in the plasma. Once a determination is made as to which etch product or species is to be detected, the system is set to monitor the wavelengths of light corresponding to those emitted by the species to be monitored. In the embodiment described herein, the system is designed to detect the light emitted by particular etch products.

Referring again to FIG. 1, there is shown also the apparatus for obtaining the EPT for the processes of the etcher. The plasma etch reactor vessel 10 includes a window 32 through which passes light emitted from the plasma. Light from the window passes to an optical filter 34 which blocks light except at preselected emission bands. In the embodiment described, the apparatus is set to monitor carbon monoxide and so filter 34 is selected to pass light in a band of about 520 nanometers. Light emitted from the plasma 30 passes through window 32 and, if of the appropriate wavelength, passes through optical filter 34 to photodiode 36. An electrical signal corresponding to the intensity of light impacting on photodiode 36 is generated by photodiode 36 and is communicated to the EPT recorder 38. In a typical prior art plasma etch reactor, the EPT trace recorder 38 provides a paper strip-chart record of the EPT trace of etch etching operation conducted in the reactor.

One of the desired reactions in the embodiment described is the etching of silicon dioxide with CF4:

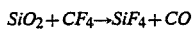

The formation of CO, and hence its spectral intensity in the plasma, decreases when all the $SiO_2$ is etched off the slice, and the above reaction ceases to produce more CO. Thus, a decrease in the CO line intensity, at times when this end-point is anticipated, is an indication that the layer has been etched off (i.e. that the end-point has been reached).

Also shown in FIG. 1 is a digital processor or computer 40 operably connected to photodiode 36 to receive the output signal or photodiode 36. Computer 40 functions in the embodiment of the present invention, among other things, to store programs and subroutines for the system, to store the reference EPT and other data, to analyze the actual EPT, to compare the reference EPT with the actual EPT, to store information regarding comparisons of the reference EPT with the actual EPT, and provide certain signals or controls to the plasma etcher or the operator of the equipment as well as other functions as desired. An output 42 from computer 40 provides signals to either the plasma etch reactor, control equipment for the plasma etch reactor, to an operator, to signal means or other means as desired. Computer 40 is programmed to conduct the comparisons of EPT's as well as other functions outlined below and may comprise a stand alone computer or may comprise a part of the computer control systems for the plasma etch reactor if such computer control system have sufficient capability to carry out the functions described below. In one embodiment of the present invention, computer 40 comprised a Texas Instruments Explorer computer with software written in LISP. The software is designed such that an EPT of any shape can be analyzed and compared with a reference EPT for the etching process.

Figure 2:
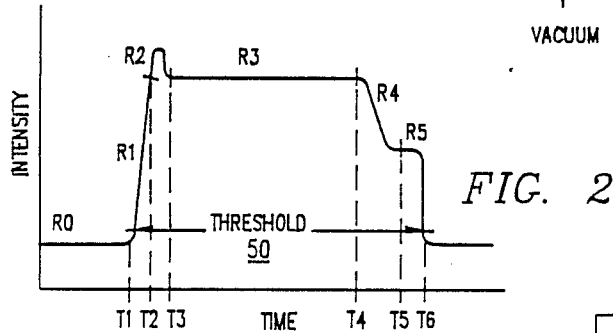
FIG. 2 shows a representation of a reference end point trace for a particular etch process for an embodiment of the present invention.

FIG. 2 shows a simulated reference EPT for a particular etch process through one layer of oxide material on a semiconductor slice in an embodiment of the present invention. In FIG. 2, intensity is plotted as a function of time. The intensity corresponds to the intensity of the signal generated by photodiode 36 in FIG. 1. As stated previously, the EPT apparatus has been preset to monitor carbon monoxide etch reaction products volatilized into the plasma. The EPT of FIG. 2 simulates a signal from photodiode 36 from a point in time prior to when the etch reaction is initiated, through several steps encountered during the plasma etch, and, finally, through the end of the plasma etch process. Accordingly, then, in FIG. 2, prior to T1 in region RO, the signal from photodiode 36 is below the threshold value 50 indicating the lack of a plasma of excited species. This indicates that the plasma etch reaction has not yet begun. At time T1, the plasma etch reaction has begun as the EPT intensity rises above the threshold level 50. The intensity of the EPT increases sharply from T1 to T2 in the region denoted R1, thus indicating the presence of a plasma of excited species and a sharp rise in the concentration in the plasma of the monitored species. R1 corresponds to a particular phase of the etching operation, as do each of the other regions R2 through R5 of the EPT. For example, R2 represents a transition point from the start-up phase R1 to the relatively stable phase R3 during which a predetermined amount of oxide material is etched from the surface of the slice and where the concentration of monitored species in the plasma remains approximately constant. Region R4 indicates a drop off in the concentration of the carbon monoxide species being monitored in the plasma, and suggests that the oxide material or layer being etched during R3 has been exhausted. The plateau of R5 corresponds to the outboard signal from the plasma itself with little or no carbon monoxide present in it. Since the intensity is relatively constant during the plateau region of R5, this indicates that little or no monitored specie is being produced. The etching operation is continued a predetermined period of time after the end-point of the oxide etch as shown in R4 so as to insure a complete clearing of oxide material from areas of the slice being etched. After the predetermined period of time, the etching operation is terminated and the plasma is no longer generated. This is shown in the steep drop off of intensity in the latter part of R5. At T6 the signal drops below the threshold value since no plasma of excited species is present.

It should be noted that the etching operation can also be designed to proceed through two or more layers of different materials. In such cases, the reference EPT, of course, would probably vary from that of FIG. 2 and include regions corresponding to the various layers and materials being etched. An example of such an EPT is shown in FIG. 7 which shows a trace corresponding to an etch through four different materials which comprise polysilicon, mitox, silicon nitride and silicon dioxide.

FIGS. 3 through 6 are structure charts illustrating the functional architecture of the software program for controlling computer 40 to accomplish one embodiment of the present invention.

Figure 3:
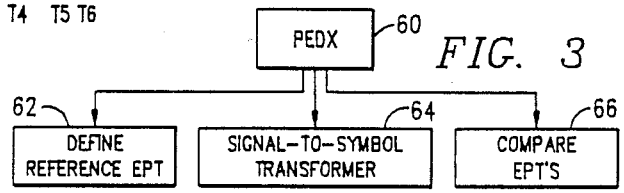
FIG. 3 shows an overview structure chart of the software for an embodiment of the present invention.

FIG. 3 shows an overview structure chart for the function of an embodiment of the present invention designed to monitor plasma etching operations. The embodiment illustrated in FIG. 3 is termed a plasma etch diagnosis expert system or "PEDX". The structure chart of FIG. 3 illustrates the functions of various parts of the system. Module 60 represents the PEDX system.

Figure 4:
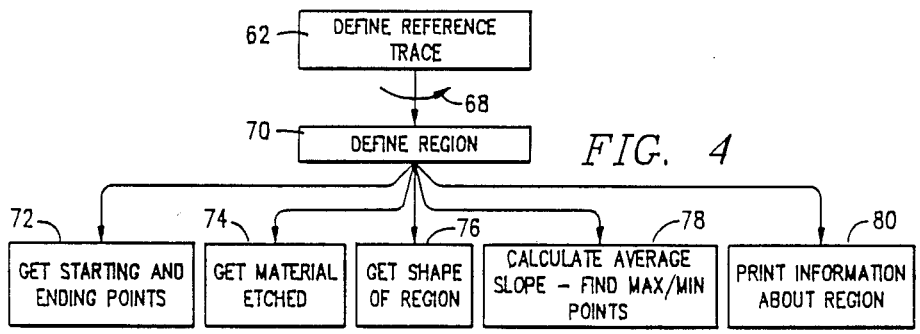
FIG. 4 is a structure chart, according to the embodiment of FIG. 3, showing the general function of defining the reference trace.

The overview structure chart of FIG. 3 shows the system illustrated in three general function modules. The first general function module is shown at 62 and comprises defining the normal trace or EPT. A structure chart illustrating in detail the specific various functions of general module 62 is shown in FIG. 4 below. The second general function of the PEDX system 60 is that of the signal to symbol transformer represented by module 64. Various functions of module 64 are illustrated and discussed more fully in conjunction with FIG. 5 below. The third general function module of the PEDX system 60 is to compare the actual end-point trace with the reference end-point trace as illustrated by module 66. The function of module 66 is discussed more fully in conjunction with FIG. 6 below.

FIG. 4 is a structure chart for the functions of module 62 of FIG. 3. Module 62 represents the general function of defining the reference trace for the embodiment of the present invention. As shown in FIG. 4, the general function of defining the reference trace comprises multiple steps of defining regions in the trace. The function of defining a region is shown in module 70. The arrow 68 indicates that function 70 is carried out several times, e.g., for each region of the trace, and is similar to a loop in a computer program flowchart. Function 70 serves to define an object to describe each region in the reference EPT. The function of defining each region of the trace 70 comprises getting the starting and ending points including their respective times of the region 72, getting or identifying the material etched during the region 74, getting the shape of the region 76, calculating an average slope and finding the maximum and minimum points of the region 78, and printing the information about the region to program files 80.

The functions shown in FIG. 4 for defining the region are carried out for each region of the reference trace. The characteristics shown in FIG. 4 for each region are defined by an operator knowledgeable of the significance of regions and characteristics of the regions of the reference trace.

Figure 5:
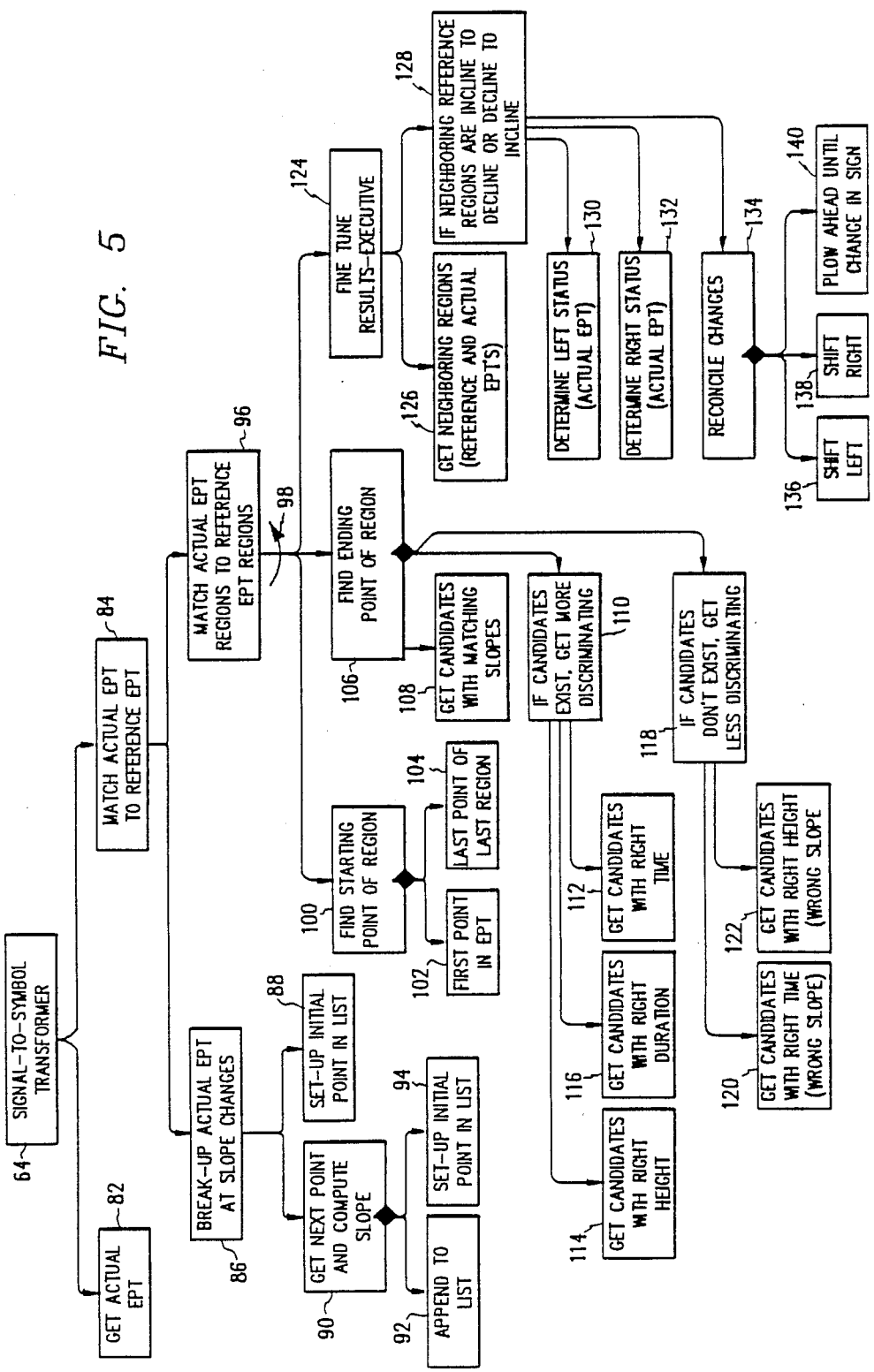
FIG. 5 is a structure chart for the embodiment of FIG. 3, showing the general function of the signal to symbol transformer.

FIG. 5 shows a structure chart for the operation of the system in carrying out the general function 64, shown in FIG. 3, of the signal to symbol transformer. Function 64 has two primary steps, the first being obtaining the actual EPT, as shown at 82. The second is matching the actual EPT to the reference EPT, illustrated at module 84. The function 84 of matching the actual EPT to the reference EPT has two primary components. The first is shown at 86 and identifies points in the actual EPT where there are significant slope changes. These points are called critical points. The adjacent points located between the critical points have similar slopes, so they are grouped together. A region is defined to be the portion of a trace between two consecutive critical points. The function of the program in identifying the critical points is shown in the function blocks flowing from functional block 86. The program first sets up an initial point in a list file 88, then goes to the next point and computes the slope 90. Depending upon the relationship with the slope computed to the slope of the initial point of the list, the program either appends the point to the list 92, or sets up a new initial point in the list 94.

As pointed out above in conjunction with FIG. 4, an object is defined to describe each region in the EPT. The attributes of this object include the average slope, maximum value and minimum value of the region, and intensities, slopes and times of the critical points as well as other attributes as desired. The set of objects for the reference EPT once defined never changes, but the set of objects describing the actual EPT may be revised by the matching function, which is the second component of the signal to symbol transformer, and which is designated in FIG. 5 as function block 84. The matching component pairs regions of the actual EPT with regions of the reference EPT. Regions are paired if they correspond to the same state of the process. The matching is difficult because the critical points of the actual and the reference EPT's may be radically different, especially where there is a problem with the etch.

In overview, the matching function matches regions of the actual EPT to regions of the reference EPT from left to right. For each region of the reference EPT, the critical points in the unmatched portion of the actual EPT are considered. A sequence of comparisons are applied to select the two critical points of the actual EPT delimiting the matching region. The system is heuristic in that the attributes are compared in order of their importance until critical points in the actual EPT that best match the critical points of the reference EPT are found. The system considers the slope at a critical point to be the most important attribute. As a result, the matching component can either merge several proposed regions of the actual EPT, split one of the regions, or select a region without making any changes of the actual EPT.

Referring again to FIG. 5, the second component of the function block 84 of matching the actual EPT to the reference EPT, as shown in function block 96, comprises matching the actual EPT regions to reference EPT regions. As represented by the arrow 98, the series of functions which follow from module 96 are repeated for each of the regions of the EPT. The first step in this function is to find the starting point of the region 100. At this step, analysis is also made to identify whether the point being considered is the first point in the EPT 102 or the last point of the last region of the EPT 104.

At 106, the program finds the ending point of the region 106. In determining the ending points of the regions, and matching them to the regions of the reference EPT, the program employs a heuristic set of functions. The first of the function is to get candidate regions with matching slopes 108. If several candidates exist, the program gets more discriminating 110, and employs additional functions. These additional functions include getting candidates with the right height 112, getting candidates with the right duration 114, and getting candidates with the right time 116. If, on the other hand, at 106 candidates don't exist, the program gets less discriminating 118 and selects candidates with the right time, but with the wrong slope 120, and also gets candidates with the right height but also with the wrong slope 122.

The third function of module 96 is fine tuning of results 124. In accomplishing this, the program gets the neighboring regions of both the reference and the actual EPT's 126, and also determines if the neighboring reference regions are incline to decline, or decline to incline 128. The system next checks the relationships of the region in the actual EPT with its neighboring regions, determining the status of the region to the left of the region of the actual EPT 130, determining the status of the region to the right 132, and then at 134 reconciling changes. This can include shifting the critical point of the region of the actual EPT to the left 136, shifting it to the right 138, or continuing on in the region until there is a change in the sign of the slope 140.

FIG. 6 is a structure chart illustrating the tasks of the program in accomplishing the functions shown in module 66 of FIG. 3, that of comparing the EPT's. As shown in FIG. 6, this function includes, for each region, getting the reference region 142, getting the actual region 144, and then firing a set of process specific rules for the region 146. As pointed out previously, the process specific rules are set out to analyze with particularity, each of the separate regions of the actual EPT, and may include a different set of comparisons and analysis for one region over another region. The step of firing the sets of process specific rules for the region 146, includes also firing the process specific rules 148 as well as the process independent rules 150.

An example of the operation of the present system in matching regions of EPT's is shown in conjunction with FIGS. 7 and 8. FIG. 7 shows an example of a reference end-point trace with intensity plotted as a function of time. FIG. 8 shows an example of an actual end-point trace to be matched by the system against the reference end-point trace of FIG. 7. In matching the regions of the actual end-point trace of FIG. 8 against the regions of the reference end-point trace of FIG. 7, the program first assumes that point A' of FIG. 8 matches point A of FIG. 7. This corresponds to function module 100 of FIG. 5. The program then selects from the actual end-point trace a point corresponding to point B of the reference end-point trace of FIG. 7. (See, e.g. function module 106 of FIG. 5). critical points B' and D' are identified as possible candidates that match the critical point B, because they all lie at the end of a region having a slope comparable to that preceding point B. The next attribute the system compares is the intensity of the critical points B' and D' to the intensity at B. In this case, critical point B' is not close to the intensity at B, but D' is close to B so D' is selected to match B and the regions between A' and D' are merged to form a single region ending at D'. In this example, remaining regions of the actual EPT are matched in straightforward manner.

Another example of the capability of the program to match regions is shown with FIG. 9. FIG. 9 shows an example of another actual EPT which the system is to compare with the reference end-point trace of FIG. 7. In the comparison under the system, point A' of FIG. 9 is matched to point A of FIG. 7. Also point B' is matched to point B and the region A' to B' (denoted Region 2') is matched against the region B to C of FIG. 7 (denoted Region 2). However, it is evident that Region 2' of FIG. 9 is of substantially longer duration than the corresponding Region 2 of FIG. 7. The system can easily handle the extended duration of Region 2' of the EPT of FIG. 9, since it does not define a critical point from point B' until there is a change in slope of a predefined magnitude. In FIG. 9, this change in slope occurs at point C'. Accordingly, the system will match Region 2' of FIG. 9, although of extended duration, against the Region 2 of shorter duration of FIG. 7. The system confirms that point C' is the appropriate critical point for the end of Region 2' by confirming that the other data for the region, e.g., intensity, etc., match what is expected for the critical point and the region. Additionally, the system confirms that the neighboring regions to Region 2' match against the corresponding expected regions of the reference EPT of FIG. 7. This illustrates the capability of the present invention to match regions of an actual end-point trace against regions of the reference end-point trace even when the regions of the actual end-point trace are of time durations significantly extended from that which is expected in light of the reference end-point trace. Moreover, it illustrates the capability of the present invention to let regions "float" over time and still be correctly matched and compared. The regions following point C' (e.g. regions C'-D' and D'-E') have been "floated" to points in time of the EPT significantly later than is normally expected for them. Yet, the present invention still functions to correctly identify and compare those regions.

So also, the system will match regions of the actual end point trace which are of shorter duration than the corresponding regions of the reference end point trace.

The examples shown in FIGS. 8 and 9 show the capability of the system to match, using the heuristic sets of functions, regions of the actual end-point trace against regions of the reference end-point trace, even when unexpected data patterns occur in the actual end-point trace. The present invention uses rules to operate on the output of the signal to symbol transformer, e. g. module 64 of FIG. 3, to detect and diagnose problems with the etch. The system consists of two sets of rules, process independent rules and process specific rules.

Process independent rules compare the regions of the actual trace to the regions of the reference trace and look for abnormalities. These rules apply to any plasma etch process, comparing the intensities, slopes and times of critical points in the reference and actual end-point traces. The conclusions of the process independent rules are symbolic, for example, the result of the rule that compares the times of two critical points may be "too early", "too late" or "no problem". The process independent rules also look for other abnormalities or irregularities in the regions such as positive or negative peaks, multiple peaks, or other abnormalities.

Process specific rules identify the cause of the problem. The rules are divided into groups; each group represents knowledge about a different region. Process specific rules are developed by process engineers which have experienced working with the particular process, and are familiar with the variety of possible problems and the shapes of the corresponding end-point traces. The process engineer writes rules for handling symptoms by identifying the appropriate process independent rule, and associating a cause, or more than one cause, with each problem. The process independent rules also call or fire sets of process independent rules in comparing, or in some regards analyzing, the regions of the traces. The process specific rules then proceed from using the findings from the process independent rules.

In analyzing the actual end-point trace of FIG. 8, the system would compare each of the regions of FIG. 8 with the regions of FIG. 7. In the comparison, the rules will ignore cases where the regions are almost identical and will detect cases where there are significant differences in the regions. In the case of the region from point A' to D' of FIG. 8, the process independent rule comparing times of critical points will note that the ending time for the last critical point D' is "too late" when compared with the time at point B in the reference curve of FIG. 7. The conclusion of the process specific rule which called the process independent rule checking the times of critical points notes that the last critical point of the region occurs too late, and also notes that the region was intended to represent the etching of a polysilicon layer. The process specific rule suggests the conclusion that the region A' to D' of the actual end point trace indicates that possibly a thin material was on the polysilicon region to be etched during the etch. This thin material on the polysilicon led to the abnormality in the EPT from points A' to D'.

The rules detect abnormalities regardless of the size of the difference outside an acceptable range. Acceptable ranges depend on empirical knowledge of the process in the manufacturing environment. The fault ranges are provided, but the process engineer can overwrite the values when writing the process specific rules. In cases where a problem is detected, the system can turn off the plasma etcher and report the diagnosis to a technician for corrective action.

The present invention detects and diagnoses bad etches due to errors in previous processes. One of the major causes of errors is in the deposition process, where either too much or too little material may have been deposited. An example of such an instance is shown in the actual EPT of FIG. 9. Region 2' has an abnormally long duration as compared to Region 2 of the reference EPT of FIG. 7. The process specfic rules applied to Region 2' would note the abnormally long etch time for the region and that the material being etched in that region is polysilicon, and then suggest the conclusion that the unusually long duration indicates that the particular polysilicon layer being etched may have been deposited too thickly on the semiconductor device. Examples of other process steps which may have been incorrectly carried out prior to the monitored etch include a photolithography step, an etch step, or other processes.

The present invention interprets end-point traces by combining signal to symbol transformations and rule base reasoning. The signal to symbol transformer and process independent rules apply to any plasma etch process or other process which provides suitable continuous variable data curves. If there is a problem with the etch, then a small set of process independent rules can detect the problem. A set of process specific rules diagnoses the problem by associating a cause with one or more symptoms.

As can be seen, the system of this embodiment of the present invention is modular so knowledge about the process being monitored is isolated at the process specific rule level. The other major components of the system, the signal-to-symbol transformer and the set of process independent rules, do not depend upon knowledge of the particular process (or etch process) being monitored and apply to any process (or etch process) providing a suitable continuously variable data curve. Consequently, this embodiment of the present invention can be easily, efficiently and quickly adapted for particularized use with any process providing suitable data curves.

The present invention has particular advantages when used with a plasma etch reactor. Many of these advantages stem from the complexity of the operation of the plasma etch reactor. This complexity arises from the numerous factors which affect whether the etching operation proceeds in an optimum fashion. Since the factors which affect the actual etching reaction are so numerous, the present invention which looks directly to characteristics of the reaction itself, rather than at operating parameters of the reactor vessel, provides a more reliable and direct means of monitoring the etch process than has heretofore been proposed. Restating the point, the embodiment of the present invention monitors process observables in contrast to process control parameters. An example of the process control parameters which can be varied in the plasma etch reactor, include varying the power, the pressure, the identity of as well as relative concentrations of the gases input to the system, the total gas flow into the reactor, and the pressure and temperature of the reactor. Some of these process control parameters are typically monitored by the hardware controls of the etch reactor.

However, numerous additional factors beyond the control parameters affect the processes inside the etch reactor. Some of these include what is referred to as chamber seasoning or the character of materials on the inside surfaces of the reactor vessel. Surface material recombinations on the interior surface of the chamber can frequently occur in an etch reactor and serve to significantly affect the progress of the etching reaction within the chamber. Another factor is the distance of the electrode from the surface of the slice. The electrode itself is also etched slightly in the operation of the reactor. After a number of etches, the distance between the surface of the slice and the electrode is increased by the etching of the electrode, and the etch reaction consequently affected. These factors which are beyond the control parameters are not readily susceptible to monitoring.

Slight variations in any one or more of the above described factors can have significant impact on whether the etching reaction proceeds in an optimum or acceptable fashion. However, due to the complexity of the interrelations of the various factors it is often difficult to predict the impact of variations in one or more of the factors on the actual etch reaction itself. In light of this complexity, the present invention provides particular advantages. The prior art hardware controls on the etcher monitor only a few of the factors affecting the reaction and as pointed out above, many of the factors are not readily susceptible to monitoring. Additionally, the hardware controls only monitor factors affecting the reaction and not the reaction itself. Accordingly, in many cases, if some factor changed and detrimentally affected the etch reaction but the hardware monitors showed a correct set of process control parameters existing (e.g., correct pressure, temperature, gas flows), the hardware monitors would not detect that the etch reaction was proceeding incorrectly. However, the present invention, by monitoring process observables (e.g., rate of production of reaction product species) much more closely monitors the actual etch reaction and is significantly more likely to detect misprocessing when it occurs than are prior systems.

Moreover, the present invention advantageously provides a system which can define and match regions of actual continuously variable curves, e.g., actual EPT's, even when those regions deviate in significant fashion from the regions of the particular reference continuously variable curve which has been defined. For example, the present invention can define regions of an actual curve which float or stretch in time. This provides a significant advantage over a curve comparison system which compares regions of curves where the regions are unchangeably defined as a function of time. Moreover, the heuristic approach of the present invention to matching critical points and regions leads to improved accuracy in defining, matching and comparing regions of curves.

An embodiment of the present invention provides the advantage of detecting process related problems that arise during a typical plasma etching process, by an examination and analysis of the end-point trace (EPT) of the plasma etch process. The early and automatic detection of such problems, can significantly and advantageously impact slice yield by preventing further misprocessing of subsequent slices. Additionally, the invention can advantageously attribute the problems detected to predefined causes and generate a signal identifying such causes.

Additionally, the present invention can be used in a real time application to monitor the etch process as it actually proceeds and, either alone or in conjunction with other systems such as expert systems, to vary or correct etch parameters during the etch when abnormalities are detected.

Additional advantages of the present invention include elimination of strip-chart recorders from the clean room, and the ability to edit large volumes of end-point traces by saving only those that show an anomalous behavior.

Another advantage is that the system functions as a process monitoring tool that complements the microprocessor based hardware monitoring function. While the hardware monitor sets alarms and halts the processing based on hardware problems (for example, no RF power, no gas flow, incorrect pressure or other similar problems), the embodiment of the present invention can warn the operator, and eventually shut off the etcher, based on reaction process related problems.

The present invention advantageously provides a system which, by focusing on etch reaction observables, can detect errors in the etching operation which cannot be detected by monitoring equipment which simply monitors the hardware functions, i.e. gas flows, temperatures, or RF power settings of the etcher. Moreover, the present invention advantageously provides a system which comprises a backup monitoring system to the hardware monitoring apparatus of matching reactor. Accordingly, if hardware monitoring sensor should fail and the hardware function proceed out of specification, the present invention would detect the problem as soon as the non-spec hardware function caused the etch reaction to vary from the reference reaction.

The present invention can be advantageously applied in numerous circumstances. For example, it can be applied in various etching operations, each of which has its own signature or reference EPT. Each of these various EPT's may have different number of regions, with each of the regions being of different shapes. Moreover, various characteristics of each region can be defined and functions for detecting or measuring such characteristics also defined, in light of considerations unique to the particular etch or region of the etch. Additionally, the present invention can be advantageously applied on processes other than plasma etch reactions.

Although the embodiment of FIG. 1 received an analog signal from the photodiode signal generator, it will be understood that the present invention has application with either analog or digital type signals.

Although the preferred embodiment has been described in detail, it should be understood that various changes, substitutions and alterations can be made therein without departing from the spirit and scope of the invention as defined by the appended claims.

What is claimed is:

1. A method of monitoring end-point traces of a plasma etch reactor comprising:
   establishing a reference end-point trace for a predetermined etch process;
   dividing the reference end-point trace into predefined regions;
   conducting the predetermined etch process on a semiconductor device;
   obtaining an actual end-point trace for the etch of the semiconductor device;
   dividing the actual end-point trace into candidate regions in accordance with predefined criteria based on changes in said actual trace;
   matching candidate regions of the actual end-point trace with corresponding regions of the reference end-point trace by analyzing characteristics of a candidate region of the actual end-point trace over characteristics of a region of the reference end-point trace to be matched; and
   comparing characteristics of regions of the actual end-point trace with corresponding characteristics of matched regions of the reference end-point trace.

2. The method of claim 1, further comprising:
   generating a signal indicative of the variance of characteristics of the regions of the actual end-point trace beyond predefined limits from corresponding characteristics of matched regions of the reference end-point trace.

3. The method of claim 2, wherein said predefined criteria for dividing the actual end-point trace into candidate regions, comprise the change in slope of points along the actual end-point trace.

4. The method of claim 3, wherein said step of comparing characteristics of regions of the actual end-point trace with corresponding characteristics of matched regions of the reference end-point trace comprises:
   applying a set of rules to at least one of the regions of the actual end-point trace.

5. The method of claim 4, wherein said set of rules comprises a set of process independent rules and a set of process specific rules.

6. The method of claim 5, wherein the application of the set of process independent rules comprises comparing, between a region of the actual end-point trace and a matched region of the reference end-point trace, at least one of:
   the value;
   the slope; and
   the time
of at least one predefined point in the respective regions.

7. The method of claim 3, further comprising:
   determining whether a deviation between a characteristic of the actual end-point trace and a corresponding characteristic of the reference end-point trace exceeds a predefined value;
   attributing such deviation to at least one predefined cause;
   generating a signal identifying said at least one predefined cause to which the deviation has een attributed.

8. The method of claim 2, wherein said step of dividing the actual end-point trace into candidate regions in accordance with predefined criteria comprises:
   determining the slope of the actual end-point trace at points along the actual end-point trace;
   determining critical points on the actual endpoint trace at which the slope changes beyond a first predefined value;
   dividing the actual end-point trace into candidate regions between the critical points determined.

9. The method of claim 2, wherein said step of matching candidate regions of the actual end-point trace with corresponding regions of the reference end-point trace by analyzing characteristics of a candidate region of the actual end-point trace in light of characteristics of a region of the reference end-point trace to be matched comprises:
   the steps of applying a set of heuristic functions to the regions of the actual end-point trace to be matched.

10. The method of claim 9, wherein said heuristic functions comprise at least one of:
    identifying regions of the actual end-point trace having an average slope which varies from the average slope of the region of the reference end-point trace to be matched by less than a predefined value;
    identifying regions of the actual end-point trace for which the intensity value of the last point of the region varies from the intensity value of the last point of the region of the reference end-point trace to be matched by less than a predefined intensity variation value;

identifying regions of the actual end-point trace which have a duration which varies from the duration of a region of the reference end-point trace by less than a predefined duration variation value; and identifying regions of the actual end-point trace occurring within a predetermined time range.

11. A method of monitoring operations in process equipment which carries out a predetermined process, which process is first monitored by a detector which provides a continuously variable signal curve corresponding to the progress of the process, and wherein a reference continuously variable signal curve can be defined which corresponds to a predefined acceptable operation of the predetermined process, the method comprising:

defining a reference continuously variable signal curve for the predetermined process;

defining characteristics for at least one region of said reference continuously variable signal curve;

conducting said predetermined process;

acquiring from the detector an actual continuously variable signal curve corresponding to the progress of the process conducted;

dividing the actual continuously variable signal curve acquired into candidate regions on the basis of changes in characteristics of the actual continuously variable signal curve;

matching candidate regions of the actual continuously variable signal curve with regions of reference continuously variable signal curve by analyzing characteristics of the candidate region of the actual continuously variable signal curve over characteristics of a region of the reference continuously variable signal curve to be matched;

comparing characteristics of at least one of the regions of the actual continuously variable signal curve with the characteristics of a matched region in the reference continuously variable signal curve; and generating a signal indicative of the variance of a characteristic of one of the regions of the actual continuously variable signal curve beyond predefined limits from a corresponding characteristic of a matched region of the reference continuously variable signal curve.

12. A method of monitoring end-point traces of a plasma etch reactor comprising:

establishing a reference end-point trace for a predetermined etch process;

dividing the reference end-point trace into predefined regions;

conducting the predetermined etch process on a semiconductor device;

obtaining an actual end-point trace for the etch of the semiconductor device;

dividing the actual end-point trace into candidate regions in accordance with predefined criteria based on changes in said actual trace; and matching candidate regions of the actual end-point trace with corresponding regions of the reference end-point trace by analyzing characteristics of a candidate region of the actual end-point trace over characteristics of a region of the reference end-point trace to be matched.

13. The method of claim 11, wherein said actual continuously variable signal curve is divided into candidate reagions by identifying critical points in the actual continuously variable signal curve, said candidate regions lying between said critical points.

14. The method of claim 13, wherein said critical points are identified on the basis of changes in slope of the actual coninuously variable signal curve.

15. The method of claim 11, wherein said step of matching candidate regions of the actual continuously variable signal with regions of the reference continuously variable signal curve comprises applying a heuristic set of functions to the candidate regions.

16. The method of claim 15, wherein said heuristic functions comprise at least one of:

identifying regions of the actual continuously variable signal curve having an average slope which varies from the average slope of the region of the reference continuously variable signal curve to be matched by less than a predefined average slope value;

identifying regions of the actual continuously variable signal curve for which the intensity value of the last point of the region varies from the intensity value of the last point of the region of the reference continuously variable signal curve to be matched by less than a predefined intensity variation value;

identifying regions of the actual continuously variable signal curve which have a duration which varies from the duration of a region of the reference continuously variable signal curve by less than a predefined duration variation value; and identifying regions of the actual continuously variable signal curve occurring within a predetermined time range.

17. The method of claim 13, wherein said step of matching candidate regions of the actual continuously variable signal with regions of the reference continuously variable signal curve comprises applying a heuristic set of functions to the candidate regions.

18. The method of claim 17, wherein said heuristic functions comprise at least one of:

identifying regions of the actual continuously variable signal curve having an average slope which varies from the average slope of the region of the reference continuously variable signal curve to be matched by less than a predefined average slope value;

identifying regions of the actual continuously variable signal curve for which the intensity value of the last point of the region varies from the intensity value of the last point of the region of the reference continuously variable signal curve to be matched by less than a predefined intensity variation value;

identifying regions of the actual continuously variable signal curve which have a duration which varies from the duration of a region of the reference continuously variable signal curve by less than a predefined duration variation value; and identifying regions of the actual continuously variable signal curve occurring within a predetermined time range.

19. The method of claim 11, wherein said steps of comparing characteristic regions of the actual continuously variable signal curve with corresponding characteristics of matched regions of the reference continuously variable signal curve comprises:

applying a set of rules to at least one of the regions of the actual continuously variable signal curve.

20. The method of claim 19, wherein said set of rules comprises a set of process independent rules and a set of process specific rules 21. The method of claim 20, wherein the application of set of process independent rules comprises comparing, between a region of the actual continuously variable signal curve and a matched region of the reference continuously variable signal curve, at least one of:
the value;
the slope; and
the time
of at least one predefined point in the respective regions.

22. The method of claim 11, further comprising:
determining whether a deviation between a characteristic of the actual continuously variable signal curve and a corresponding characteristic of the reference continuously variable signal curve exceeds a predefined value;
attributing such deviation to at least one predefined cause; and
generating a signal identifying said at least one predefined cause to which the deviation has been attributed.

23. The method of claim 11, wherein said step of dividing the actual continuously variable signal curve into candidate regions comprises:
determining the slope of the actual continuously valuable signal curve at points along the actual continuously variable signal curve;
determining critical points on the actual continuously variable signal curve at which the slope changes beyond a first predefined value; and
dividing the actual continuously variable signal curve into candidate regions between the critical points determined.

24. The method of claim 11, wherein said predetermined process comprises a plasma etch.

25. The method of cliam 18, wherein said predetermined process comprises a plasma etch.

26. The method of claim 21, wherein said predetermined process comprises a plasma etch.

27. The method of claim 8, wherein the duration of said candidate regions is modified to improve the match of candidate regions of the actual end-point trace to regions of the reference end-point trace.

28. A method of monitoring end-point traces of a plasma etch reactor comprising:
establishing a reference end-point trace for predetermined etch process;
identifying critical points in the reference end-point trace;
identifying regions of said reference end-point trace between said critical points;
conducting the predetermined etch process on a semiconductor device;
obtaining an actual end-point trace for the etch of the semiconductor device;
identifying candidate critical points in the actual end-point trace on the basis of changes in slope of the actual end-point trace;
dividing the actual end-point trace into candidate regions between said candidate critical points;
matching candidate regions of the actual end-point trace with regions of the reference end-point trace;
comparing at least one characteristic of at least one region of the actual end-point trace with a corresponding characteristic of a corresponding region of the reference end-point trace; and
generating an indication if said at least one characteristic of the said at least one region of the actual end-point trace varies beyond a predefined limit from the corresponding characteristic of the corresponding region of the reference end-point trace.

29. The method of claim 28 wherein said step of matching candidate regions of the actual end-point trace with regions of the reference end-point trace comprises comparing characteristics of a candidate region of the actual end-point trace with characteristics of a region of the reference end-point trace.

30. The method of claim 29 wherein said step of matching candidate regions of the actual end-point trace with corresponding regions of the reference end-point trace further comprises:
applying a heuristic set of functions which compare characteristics of a candidate regions with characteristics of a region of the reference end-point trace.

31. The method of claim 30 wherein said set of heuristic functions compares at least one of the following characteristics:
the slope at the end of the candidate region;
the average slope of the region;
the intensity of the final point of the region;
the average intensity of the region;
the duration of the region; and
the time of the region from the beginning of the end-point trace.

32. The method of claim 31 wherein said step of matching a candidate region of the actual end-point trace with a region of the reference end-point trace further comprises:
comparing the characteristics of at least one region neighboring the candidate region of the actual end-point trace with characteristics of a corresponding region neighboring the region of the reference end-point trace to be matched.

33. The method of claim 32, wherein the limits of said candidate region being matched are adjusted beyond the candidate critical points identified on the basis of changes in slope, said adjustment being made to more accurately match candidate regions of the actual end-point trace with regions of the reference end-point trace.

34. A process monitoring apparatus comprising:
a data storer for receiving reference data representing a reference continuously variable signal curve corresponding to a predefined process;
an acquirer for acquiring actual data representing an actual continuously variable signal curve corresponding to an actual operation of said predefined process;
a processor which divides the actual data into candidate regions based on changes in characteristics of the actual data;
a matcher which matches at least one candidate region of the actual data with a region of the reference data by analyzing characteristics of the candidate region over characteristics of at least one region of the reference data;
a comparer for comparing characteristics of at least one region of the actual data with characteristics of a region of the reference data with which the region of the actual data has been matched; and a generator which generates a signal indicative of the variance of a characteristic of a region of the actual data beyond a predefined limit from a corresponding characteristic of a region of the reference data which has been matched with the region of the actual data.

35. The apparatus of claim 34, wherein said processor serves to divide the actual data into candidate regions on the basis of changes in slope of the actual data.

36. The apparatus of claim 35, wherein said matcher applies a heuristic set of functions to the candidate region to match it with a region of the reference data.

37. The apparatus of claim 36 wherein said predefined process comprises a plasma etch operation.

38. The apparatus of claim 37, wherein said actual continuously variable signal curve comprises an endpoint trace signal from a plasma etcher.

39. A process monitoring apparatus comprising:
a data storer for receiving reference data representing a reference continuously variable signal curve corresponding to a plasma etch process;
an acquirer for acquiring actual data representing an actual continuously variable signal curve corresponding to an actual operation of said plasma etch process;
a processor which divides the actual data into candidate regions based on changes in characteristics of the actual data; and
a matcher which matches at least one candidate region of the actual data with a region of the reference data by analyzing characteristics of the candidate region over characteristics of at least one region of the reference data.

* * * * *